United States Patent
Chuang et al.

(10) Patent No.: US 6,770,520 B2
(45) Date of Patent: Aug. 3, 2004

(54) FLOATING GATE AND METHOD OF FABRICATING THE SAME

(75) Inventors: Ying-Cheng Chuang, Taoyuan Hsien (TW); Chung-Lin Huang, Taichung (TW); Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/436,800

(22) Filed: May 13, 2003

(65) Prior Publication Data

US 2004/0033655 A1 Feb. 19, 2004

(30) Foreign Application Priority Data

Aug. 15, 2002 (TW) ........................................ 91118388 A

(51) Int. Cl.[7] .................... H01L 21/337; H01L 21/8234
(52) U.S. Cl. .................. 438/197; 438/199; 438/200; 438/211; 438/257; 438/585; 438/593
(58) Field of Search ................................. 438/197, 199, 438/200, 211, 257, 585, 592, 593; 257/314, 315

(56) References Cited

U.S. PATENT DOCUMENTS

| | | | | | |
|---|---|---|---|---|---|
| 5,545,578 | A | * | 8/1996 | Park et al. | 438/303 |
| 5,796,151 | A | * | 8/1998 | Hsu et al. | 257/410 |
| 5,858,840 | A | * | 1/1999 | Hsieh et al. | 438/266 |
| 6,117,733 | A | * | 9/2000 | Sung et al. | 438/265 |
| 6,329,685 | B1 | * | 12/2001 | Lee | 257/314 |
| 6,333,250 | B1 | * | 12/2001 | Kim | 438/595 |
| 6,483,146 | B2 | * | 11/2002 | Lee et al. | 257/317 |
| 6,528,844 | B1 | * | 3/2003 | Hopper et al. | 257/316 |
| 6,656,796 | B2 | * | 12/2003 | Chan et al. | 438/266 |

* cited by examiner

Primary Examiner—Maria Guerrero
(74) Attorney, Agent, or Firm—Quintero Law Office

(57) ABSTRACT

A floating gate and fabrication method thereof. A semiconductor substrate is provided, on which a gate dielectric layer, a conducting layer, and a patterned hard mask layer are sequentially formed. The surface of the conducting layer is covered by the patterned hard mask layer to form a gate. The conducting layer is etched to a predetermined depth to form an indentation using the patterned hard mask layer as a mask. The conducting layer is oxidized to form an oxide layer on the surface of the conducting layer. The oxide layer and the conducting layer are etched to form multiple tips using the patterned hard mask layer as a mask.

10 Claims, 4 Drawing Sheets

FLOATING GATE AND METHOD OF FABRICATING THE SAME

BACKGROUND OF THE INVENTION

1. Field of the Invention

The invention is relates to a floating gate, and more particularly to a floating gate with multiple tips and a method for fabricating the same.

2. Description of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is that it is electrically programmed, but for erasing, still requires exposure to ultraviolet (UV) light.

In many circuit designs it is desirable to have a non-volatile memory device that can be erased and reprogrammed in-circuit, without the need to remove the device for erasing and reprogramming.

EEPROM devices have the advantage of electrical programming and erasing, achieved by charging and discharging actions controlled by the control gate. The actions also affect the conductivity of the channel between source and drain.

One of the advantages of flash memory is its capacity for block-by-block memory erasure. Furthermore, memory erasure is fast, normally taking just 1 to 2 seconds for the complete removal of a whole block of memory. Another advantage of flash memory is low power consumption. The voltages of a control gate, a source, and a drain are adjusted to program or erase in a split gate flash memory.

FIGS. 1a to 1c are cross-sections of the conventional method for fabricating a floating gate of a split gate flash memory.

In FIG. 1a, a silicon substrate 101 is provided. A gate oxide layer 102, a doped polysilicon layer 103, and a nitride layer 104 having an opening 105 are sequentially formed on the silicon substrate 101.

In FIG. 1b, the doped polysilicon layer 105 exposed by the opening 105 is oxidized to form an oxide layer 106 with a Bird's Beak shape edge.

In FIG. 1c, the nitride layer 104 is removed. The doped polysilicon layer 103 is anisotropically etched to form a floating gate 103a using the oxide layer 106 as an etching mask.

A split gate flash memory is completed after a control gate is formed on the floating gate and the silicon substrate 101 is implanted to form source/drain devices.

In the program step, high voltage is applied between the source and drain. More high voltage is applied to the control gate and goes to the floating gate by the electric capacity coupling, and a high electric field is produced on the film gate oxide layer. The voltage is injected into the floating gate through the film gate oxide layer from the drain.

In the erase step, high voltage is applied between the drain and the control gate. A high electric field is produced on the film gate oxide layer by the electric capacity coupling. The voltage is injected into the drain through the film gate oxide layer from the floating gate. The gate oxide layer is damaged by the high voltage.

When the edge of the floating gate is a tip, the electrical field is easily concentrated, and the point is easily discharged. If the point discharge is increased, erasing effect is stronger.

In addition, the die size is larger due to the addition of programming circuitry and there are more processing and testing steps involved in the manufacture of these types of memory devices.

SUMMARY OF THE INVENTION

The present invention is directed to a floating gate with multiple tips and a method for fabricating the same.

Accordingly, the present invention provides a method for forming a floating gate. A semiconductor substrate is provided. A gate dielectric layer, a conducting layer, and a patterned hard mask layer are sequentially formed on the surface of the semiconductor substrate. The surface of the conducting layer is covered by the patterned hard mask layer to form a gate. The conducting layer is etched to a predetermined depth to form an indentation using the patterned hard mask layer as a mask. The conducting layer is oxidized to form an oxide layer on the surface of the conducting layer. The oxide layer and the conducting layer are sequentially etched to form a multiple tip conducting layer as a floating gate using the patterned hard mask layer as a mask. The patterned hard mask layer is removed.

Accordingly, the present invention also provides a method for forming a floating gate. A semiconductor substrate is provided. A gate dielectric layer, a conducting layer, a hard mask layer, and a patterned resist layer are sequentially formed on the surface of the semiconductor substrate. The surface of the hard mask layer is covered by the patterned resist layer to form a gate. The patterned resist layer is removed. The conducting layer is etched to form a remaining conducting layer using the hard mask layer as a mask. The remaining conducting layer is oxidized to form an oxide layer on the surface of the exposed conducting layer and the exposed remaining conducting layer. The oxide layer and the conducting layer are sequentially etched to form a multiple tip conducting layer as a floating gate using the hard mask layer as a mask. The hard mask layer and the exposed oxide layer are removed.

Accordingly, the present invention also provides a floating gate formed on the surface of the semiconductor substrate comprising a conductive base and a conductive protruding layer. The conductive base has a first top portion and a first bottom portion. An edge of the first top portion is a first tip. The first bottom portion contacts the semiconductor substrate. The conductive protruding layer protrudes from the conductive base. The conductive protruding layer has a flat top. The conductive protruding layer has a second top portion and a second bottom portion. An edge of the top portion is a second tip. The second bottom portion contacts the first top portion. The conductive protruding layer has two concave sidewalls. A multiple tip floating gate is composed of the conductive base and the conductive protruding layer.

Accordingly, the present invention also provides a floating gate formed on the semiconductor substrate, and a gate dielectric layer is formed between the floating gate and the semiconductor substrate. The floating gate comprises a base poly layer and a protruding poly layer. The base poly layer has a first top portion and a first bottom portion. An edge of the first top portion is a first tip. The first bottom portion contacts the gate dielectric layer. The protruding poly layer protrudes from the base poly layer. The protruding poly layer is flat top. The protruding poly layer has a second top portion and a second bottom portion. An edge of the second portion is a second tip. The second bottom portion contacts the first top portion. The protruding poly layer has two concave sidewalls. A multiple tip floating gate is composed of the base poly layer and the protruding poly layer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2f are cross-sections of the method for fabricating a multiple tip floating gate of a split gate flash memory of the present invention.

Figure 1A:
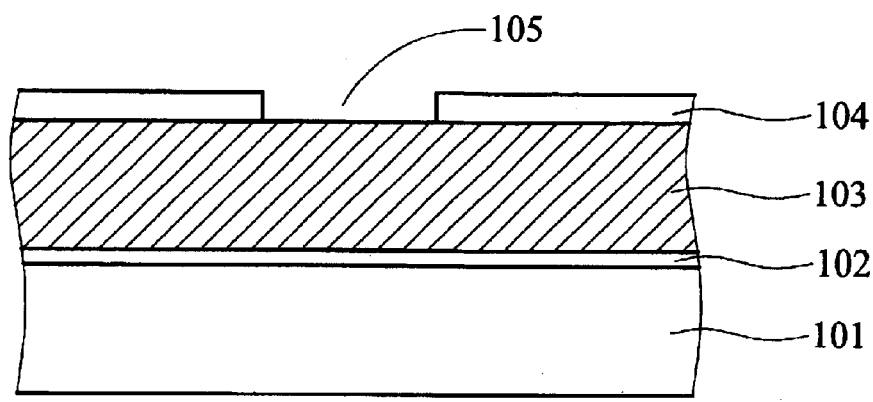
FIGS. 1a to 1c are cross-sections of the conventional method for fabricating a floating gate of a split gate flash memory.
Figure 1B:
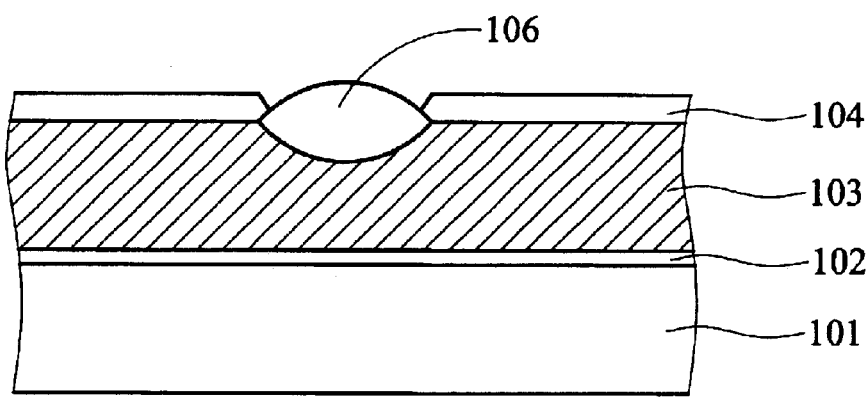
Figure 1C:
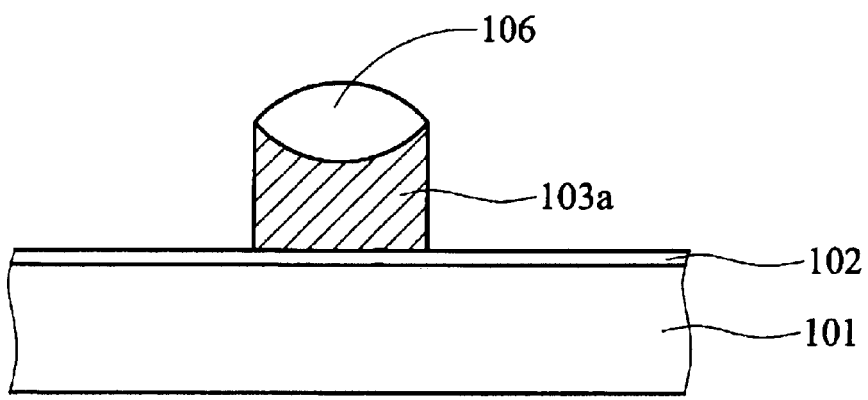
Figure 2A:
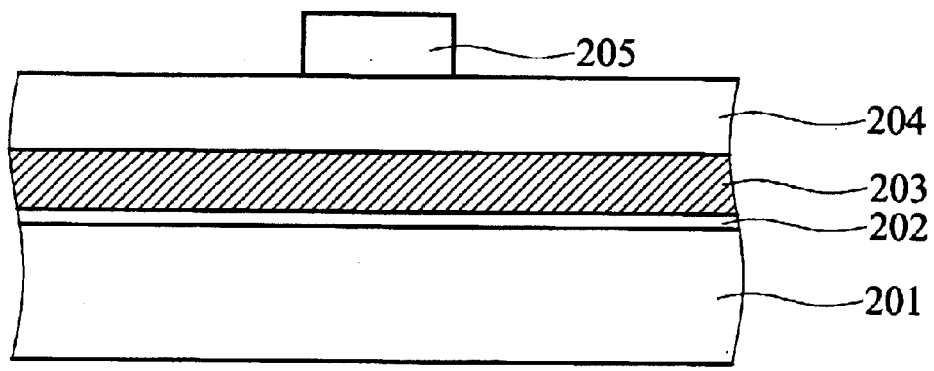
FIGS. 2a to 2f are cross-sections of the method for fabricating a multiple tip floating gate of a split gate flash memory of the present invention.

In FIG. 2a, a semiconductor substrate 201, such as silicon, is provided. A gate dielectric layer 202, such as gate oxide layer, a conducting layer 203, such as poly layer, a hard mask layer 204, such as nitride layer, and a patterned resist layer 205 are sequentially formed on the surface of the semiconductor substrate 201.

Figure 2B:
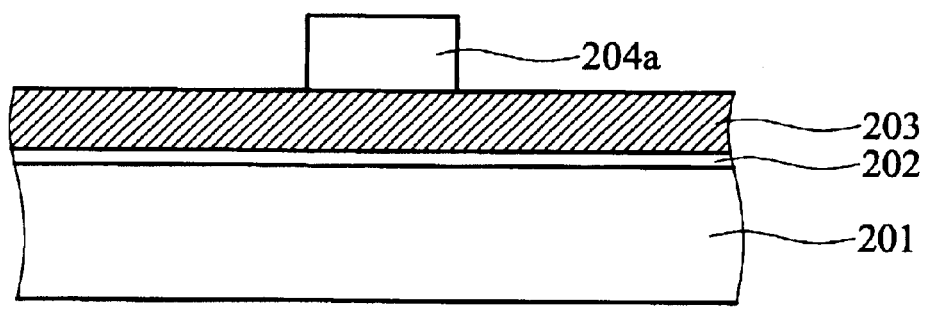

In FIG. 2b, the hard mask layer 204 is etched to form a hard mask layer 204a using the patterned resist 205 as an etching mask. The patterned resist layer 205 is removed.

Figure 2C:
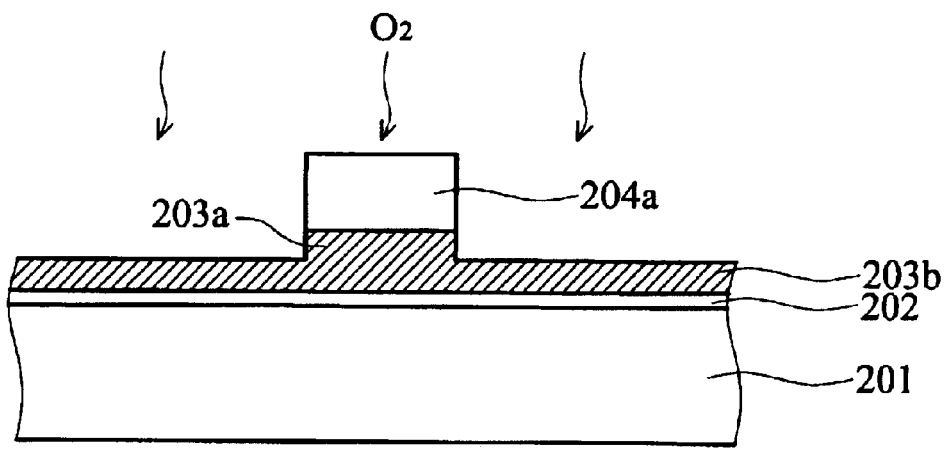

In FIG. 2c, the conducting layer 203 is etched to form a protruding conducting layer 203a and a remaining conducting layer 203b using the hard mask layer 204a as an etching mask. The protruding conducting layer 203a is formed under the hard mask layer 204a, and the remaining conducting layer 203b is the conducting layer not covered by the hard mask layer 204a. The thickness of the remaining conducting layer 203b is less than the protruding conducting layer 203a.

Figure 2D:
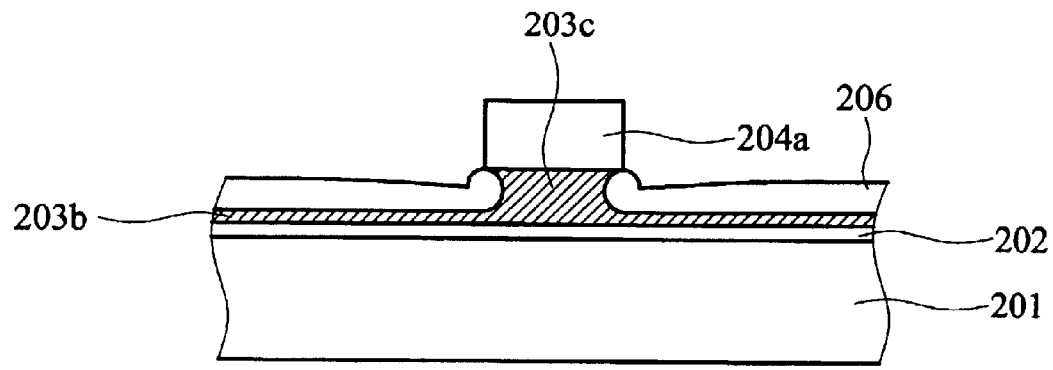

In FIG. 2d, the exposed protruding conducting layer 203a and the exposed remaining conducting layer 203b are oxidized to form an oxide layer 206, such as silicon oxide layer, thereon. The oxidizing process is thermal oxidation.

Figure 2E:
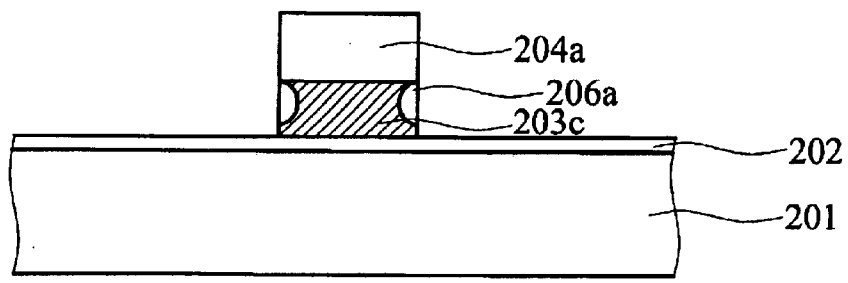

In FIG. 2e, the oxide layer 206 and the remaining conducting layer 203b are sequentially etched to form the oxide layer 206a and the conducting layer 203c using the hard mask layer 204a as an etching mask. The oxide layer 206a is formed on the sidewall of the conducting layer 203c, wherein a top edge of the conducting layer 203c is a tip by the Bird's beak shape oxide layer, and a bottom edge of the conducting layer 203c is also a tip.

The oxide layer 206 seals against oxygen, such that the conducting layer 203c covered by the hard mask layer 204a is not oxidized.

Figure 2F:
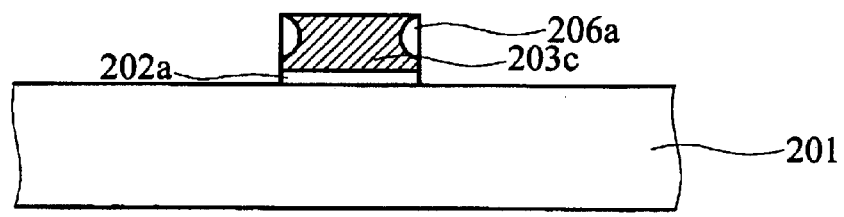

In FIG. 2f, the hard mask layer 204a and the exposed gate dielectric layer 202 are removed, and the gate dielectric layer 202a under the conducting layer 203c remains.

Figure 2G:
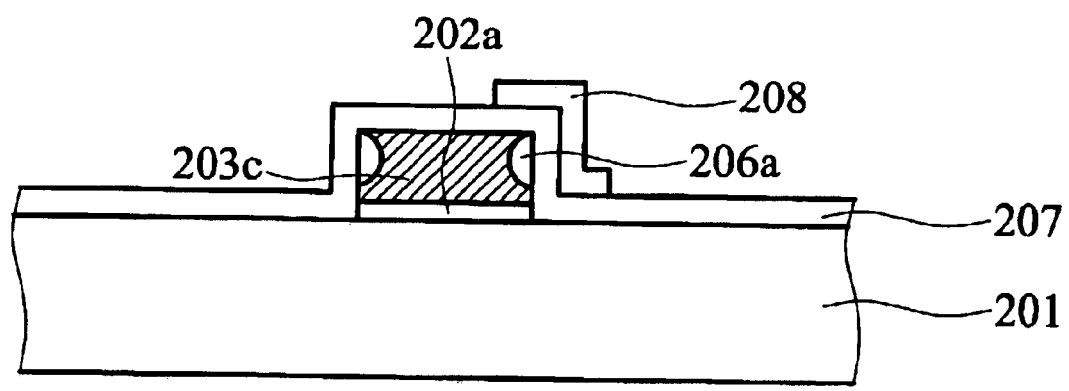
FIG. 2g is the cross-section of the multiple tip floating gate of a split gate flash memory of the present invention.

In FIG. 2g, an inter-gate dielectric layer 207, such as oxide layer, and a control gate 208 are sequentially formed on the multiple tip floating gate, and a complete flash memory is formed.

The multiple tip floating gate 203c of the present invention is composed of a conductive base 203d and a conductive protruding layer 203e. The conductive base 203d has a first top portion and a first bottom portion, wherein an edge of the first top portion is a tip, and the first bottom portion contacts the semiconductor substrate 201. A gate dielectric layer 202a is formed between the first bottom portion and the semiconductor substrate 201. The conductive protruding layer 203e protrudes from the conductive base 203d, and the conductive protruding layer 203e has a flat top. The conductive protruding layer 203e has a second top portion and a second bottom portion, wherein the second top portion is a second tip, and the second bottom contacts the first top portion. The conductive protruding layer 203e has two concave sidewalls. A multiple tip floating gate is composed of the conductive base 203d and the conductive protruding layer 203e.

The floating gate of the present invention provides a conducting layer 203c with a tip of the top edge by the Bird's beak shape oxide layer and another tip of the bottom edge.

Concentration of the electric field easily occurs in the tip, and the point is easily discharged. Point discharge is increased because of the floating gate's multiple tips in the present invention. Therefore, data erasing for the flash memory having the floating gate with multiple tips is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a floating gate, comprising:
   providing a semiconductor substrate, wherein a gate dielectric layer, a conducting layer, and a patterned hard mask layer are sequentially formed on the semiconductor substrate, and the surface of the conducting layer is covered by the patterned hard mask layer to form a gate;
   etching the conducting layer to a predetermined depth to form an indentation using the patterned hard mask layer as a mask;
   thermally oxidizing the conducting layer to form an oxide layer on the surface of the conducting layer, wherein a portion of the oxide layer is covered under the patterned hard mask layer;
   sequentially etching the oxide layer and the conducting layer to form a multiple tip conducting layer as a floating gate using the patterned hard mask layer as a mask, leaving the portion of the oxide layer covered under the pattered hard mask layer; and
   removing the patterned hard mask layer.

2. The method for forming a floating gate of claim 1, wherein the gate dielectric layer is a gate oxide layer.

3. The method for forming a floating gate of claim 1, wherein the conducting layer is a poly layer.

4. The method for forming a floating gate of claim 1, wherein the patterned hard mask layer is a nitride layer.

5. The method for forming a floating gate of claim 1, wherein the oxide layer is a silicon oxide layer.

6. A method for forming a floating gate, comprising:
   providing a semiconductor substrate;
   sequentially forming a gate dielectric layer, a conducting layer, a hard mask layer, and a patterned resist layer on the semiconductor substrate, wherein the surface of the hard mask layer is covered by the patterned resist layer to form a gate;

etching the hard mask layer using the patterned resist layer as a mask;

removing the patterned resist layer;

etching the conducting layer to form a remaining conducting layer using the hard mask layer as a mask;

thermally oxidizing the remaining conducting layer to form an oxide layer on the surface of the exposed conducting layer and the exposed remaining conducting layer, wherein a portion of the oxide layer on the surface of the exposed conducting layer is covered under the hard mask layer;

etching the oxide layer and the conducting layer to form a multiple tip conducting layer as a floating gate using the hard mask layer as a mask, leaving the portion of the oxide layer covered under the patterned hard mask layer; and removing the hard mask layer and the exposed oxide layer.

7. The method for forming a floating gate of claim 6, wherein the gate dielectric layer is a gate oxide layer.

8. The method for forming a floating gate of claim 6, wherein the conducting layer is a poly layer.

9. The method for forming a floating gate of claim 6, wherein the mask layer is a nitride layer.

10. The method for forming a floating gate of claim 6, wherein the oxide layer is a silicon oxide layer.

* * * * *